(12) United States Patent
Jerome et al.

(10) Patent No.: US 8,815,641 B2
(45) Date of Patent: Aug. 26, 2014

(54) DIAMOND SOI WITH THIN SILICON NITRIDE LAYER AND RELATED METHODS

(75) Inventors: Rick C. Jerome, Indialantic, FL (US); Francois Hebert, San Mateo, CA (US); Craig McLachlan, Melbourne Beach, FL (US); Kevin Hoopingarner, Palm Bay, FL (US)

(73) Assignee: Soitec, Bernin (FR)

( * ) Notice: Subject to any disclaimer, the term of this patent is extended or adjusted under 35 U.S.C. 154(b) by 763 days.

(21) Appl. No.: 12/719,988

(22) Filed: Mar. 9, 2010

(65) Prior Publication Data

US 2011/0186840 A1   Aug. 4, 2011

Related U.S. Application Data

(60) Provisional application No. 61/299,702, filed on Jan. 29, 2010.

(51) Int. Cl.
*H01L 29/06* (2006.01)
*H01L 21/20* (2006.01)

(52) U.S. Cl.
USPC ............ 438/105; 438/455; 438/459; 438/479

(58) Field of Classification Search
USPC .............................. 257/77, E23.111; 438/105
See application file for complete search history.

(56) References Cited

U.S. PATENT DOCUMENTS

| | | | |
|---|---|---|---|
| 5,387,555 A | 2/1995 | Linn et al. | |
| 5,552,345 A * | 9/1996 | Schrantz et al. | 438/460 |
| 6,964,880 B2 | 11/2005 | Ravi | |
| 2004/0180512 A1 | 9/2004 | Linn et al. | |
| 2004/0256624 A1* | 12/2004 | Sung | 257/77 |
| 2005/0017351 A1* | 1/2005 | Ravi | 257/720 |
| 2005/0019967 A1* | 1/2005 | Ravi | 438/26 |
| 2007/0284660 A1* | 12/2007 | Deguet et al. | 257/347 |

OTHER PUBLICATIONS

U.S. Patent and Trademark Office, "Office Action", "U.S. Appl. No. 12/887,797", Jul. 31, 2012.

* cited by examiner

*Primary Examiner* — Victor A Mandala
*Assistant Examiner* — William Harriston
(74) *Attorney, Agent, or Firm* — TraskBritt

(57) ABSTRACT

A method and structure for a semiconductor device including a thin nitride layer formed between a diamond SOI layer and device silicon layer to block diffusion of ions and improve lifetime of the device silicon.

9 Claims, 4 Drawing Sheets

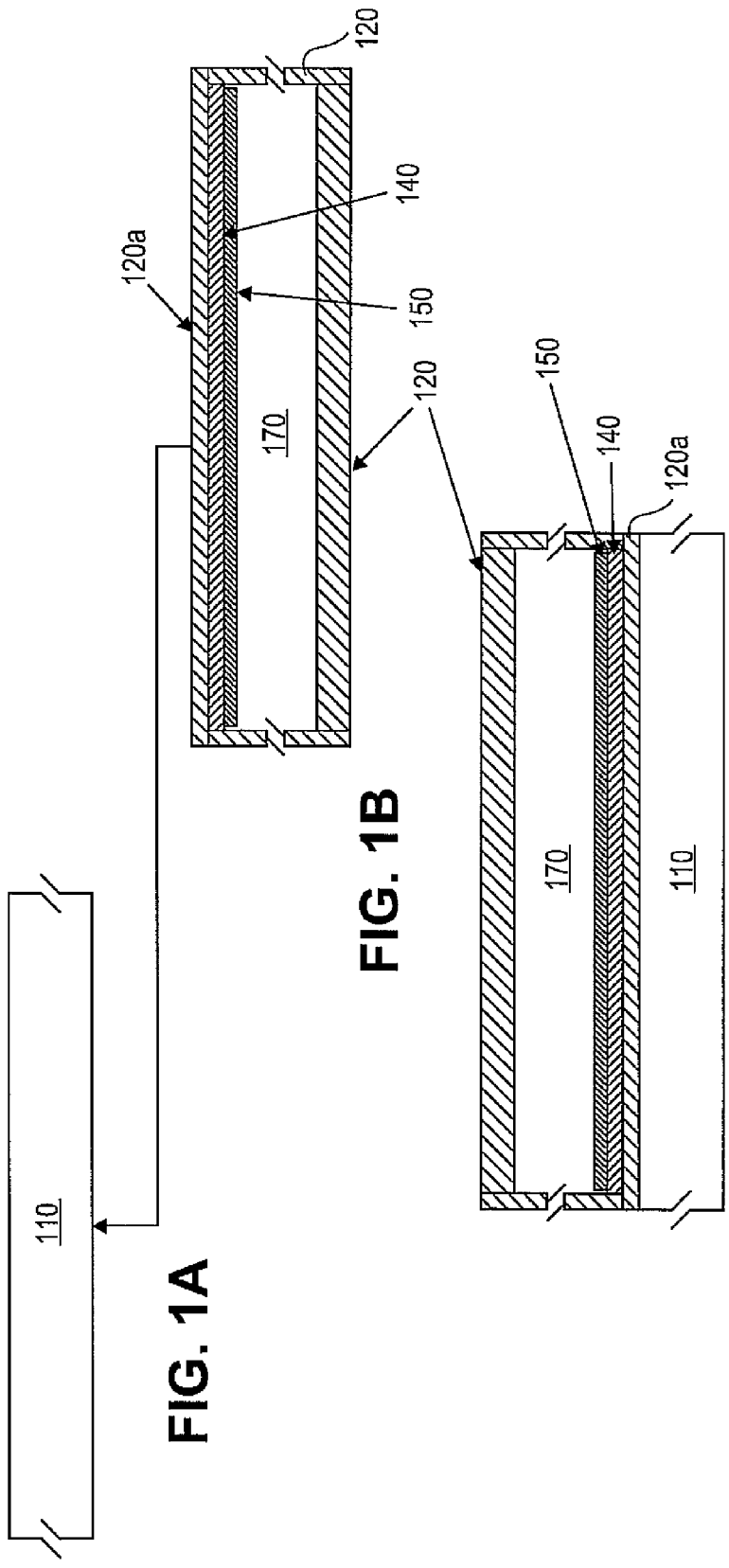

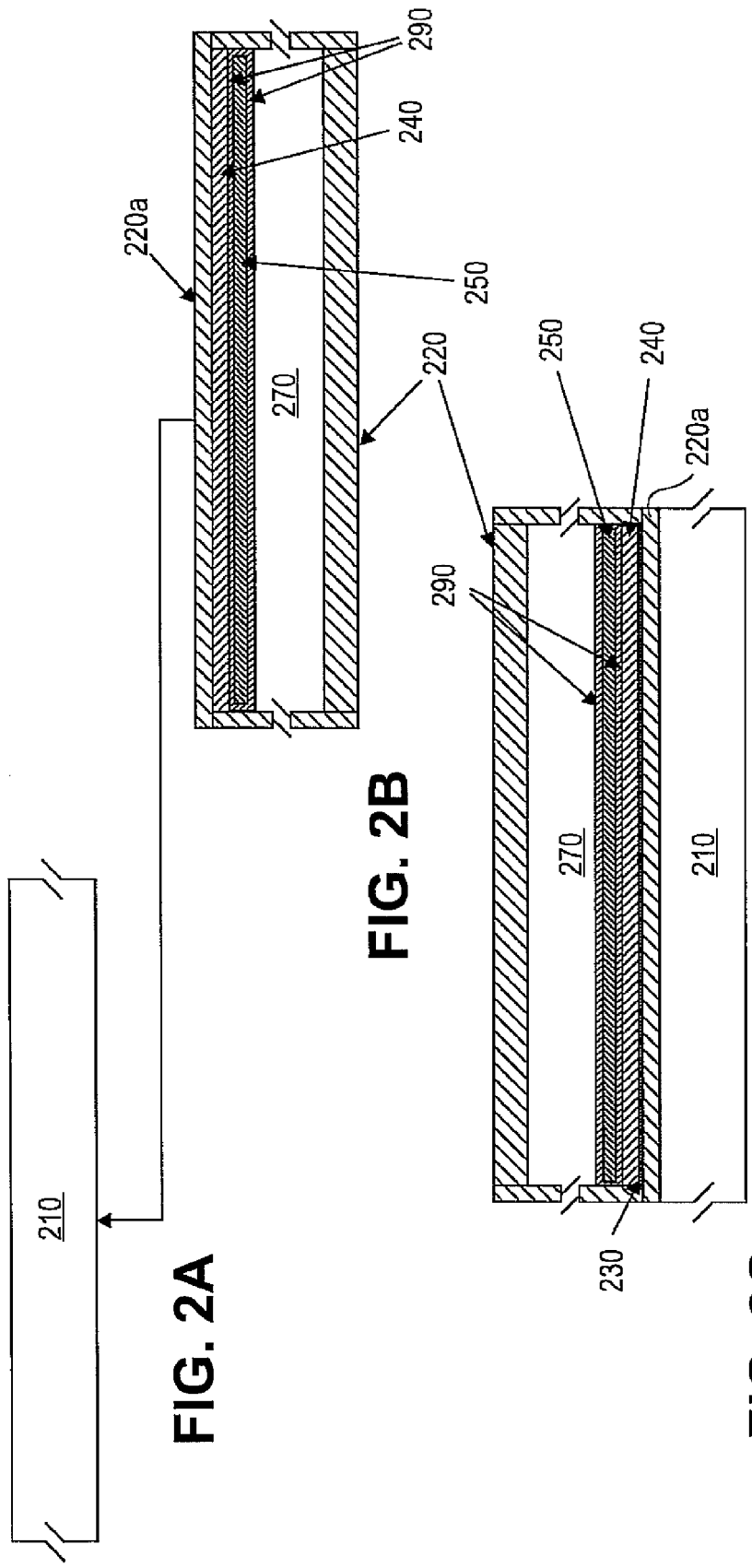

DIAMOND SOI WITH THIN SILICON NITRIDE LAYER AND RELATED METHODS

CROSS-REFERENCE TO RELATED APPLICATION

This application claims the benefit of priority to U.S. Provisional Application No. 61/299,702, filed on Jan. 29, 2010, which is incorporated by reference herein in its entirety.

BACKGROUND

Diamond SOI, Silicon-on-Diamond-on-Silicon (SODOS), Diamond-on-Silicon, and Thin Silicon-on-Thick Diamond process technologies are being developed to enhance heat flow through the substrate for use in high power devices. In the case of SODOS, the buried diamond layer is used as a heat sink—a heat spreader that reduces the temperature of semiconductor devices operating at high power in the device silicon above. Thermal conductivity of diamond is 10× better than silicon and 1000× better than oxide.

Despite high-purity components used in the HFCVD reactor (Hot Filament Chemical Vapor Deposition), elevated levels of mobile heavy metal ions have been found to out-diffuse from the diamond and seed layer into the adjacent device silicon layer, thus degrading the quality of the silicon and reducing electron and hole current carrier lifetime. During subsequent diffusion operations these ions can out-diffuse from the diamond and silicon layers and cross-contaminate fabrication processing equipment.

An improved diamond SOI device and method of forming the same would be desirable, in which a barrier can be formed between the diamond SOI layer and the device silicon layer to block diffusion of ions and improve carrier lifetime of the device silicon.

BRIEF DESCRIPTION OF DRAWINGS

The accompanying drawings, which are incorporated in and constitute a part of this specification, illustrate embodiments of the invention and, together with the description, serve to explain the principles of the invention. In the figures:

FIGS. 1A through 1E depict a diamond SOI device and corresponding method of forming, in accordance with embodiments of the present teachings; and FIGS. 2A through 2E depict a further exemplary diamond 501 device and corresponding method for forming, in accordance with embodiments of the present teachings.

Figure 1D:
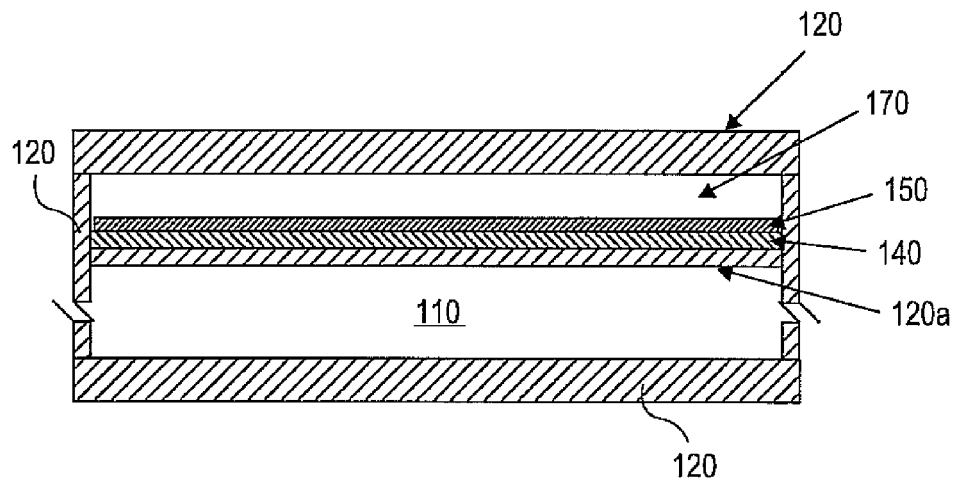

It should be noted that some details of the figures have been simplified and are drawn to facilitate understanding of the inventive embodiments rather than to maintain strict structural accuracy, detail, and scale.

DETAILED DESCRIPTION

Reference will now be made in detail to the present embodiments (exemplary embodiments) of the invention, examples of which are illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

Embodiments of the present teachings can provide a method for and device in which a thin nitride barrier (silicon nitride or one of the other nitrides) placed between the diamond SOI layer and the device silicon layer blocks the diffusion of ions into the device layer and improves lifetime of the device silicon. In accordance with the above described embodiments, a diamond seed layer and corresponding grown diamond layer have high levels of metallic and mobile ion contaminates. The thin nitride layer between diamond layer and device silicon will block the diffusion of contaminates into the device silicon layer above the diamond layer as well as a handle or substrate below the diamond layer, and improves carrier lifetime of the device silicon.

The thin nitride layer has minimal effect on the thermal conductivity of the diamond-SOI layer. In certain embodiments, a polysilicon layer on top of the thin nitride layer promotes seeding density when a moat clean (moat clean is a B-clean, described below, with a longer HCL rinse) is used to remove contaminate ions from the diamond seed layer. Moreover, the thin nitride layer considerably simplifies a subsequent trench isolation process.

With the use of a thin nitride layer between the diamond layer and device silicon, oxidation of the diamond layer can be blocked, and further provide a good etch stop for a silicon trench etch, a subsequent operation that may be used to laterally isolate devices on the surface of the wafer.

FIGS. 1A through 1E depict a diamond silicon-on-insulator (SOI) device (e.g., 100 in FIG. 1E) and corresponding method of forming, in accordance with embodiments of the present teachings. It should be readily apparent to one of ordinary skill in the art that the device 100 and method depicted in FIGS. 1A through 1E represents a generalized schematic illustration and that other steps and components can be added or existing steps and components can be removed or modified.

Figure 1E:
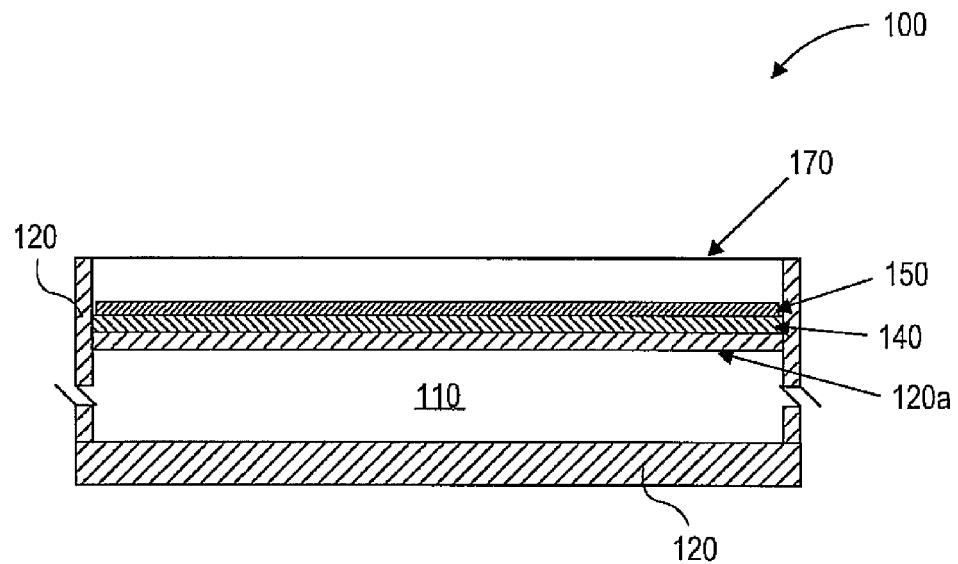

In FIG. 1E, the device structure 100 can include a handle wafer 110, a planarized polysilicon 120 on the handle wafer 110, a diamond layer 140 on the planarized polysilicon 120, a thin nitride layer 150 on the diamond layer 140, a device 170 formed on the thin nitride layer 150, and a polysilicon encapsulant 120, the polysilicon encapsulant 120 planarized and removed from the device side as shown.

In FIG. 1A, the handle wafer 110 is depicted, which is suitable for the exemplary embodiments. The handle wafer 110 can include an oxide material. The handle wafer 110 can include an oxide material or layers, on part or all of its surfaces. The handle wafer 110 can be formed in a process including, for example, steps of spin rinse-dry (SRD), BW Backtouch, potassium hydroxide (KOH) clean, Scribe, Post Backtouch clean (where HF strips oxide from handle wafer, sulfuric, Standard Clean 1, Standard Clean 2), and bond clean.

An exemplary device wafer 170 is depicted in FIG. 1B. The device wafer 170 can include a thin nitride layer 150 on a surface of the device wafer, a diamond layer 140 on a surface of the thin nitride layer 140, and a polysilicon coating 120 on the diamond layer 140 and the opposing surface of the device wafer 170.

The device wafer 170 can include a substrate, wafer or epitaxial layer, silicon or other semiconductor layer. In general, the semiconductor layer can be any material that can withstand diamond growth conditions (temperatures greater than 700° C., for example). For example, the semiconductor can include at least one of silicon, SiGe, SiC, GaN, InP, GaAs, AlGaN, InAlN, or combinations thereof. It will be appreciated that the handle or device wafers can be either N- or P-type, with low or high doping concentration, depending on the application.

The device wafer 170 can be formed in a process in which the wafer is typically pre-cleaned in SC1/SC2 solutions, for example, and in which silicon nitride is deposited via a LPCVD (low pressure chemical vapor deposition) process to a thickness of about 1000 Å. Subsequent to formation of the device wafer 170, a diamond seed layer can be chemically deposited by immersion in a colloid solution containing nanoparticles of diamond dust (not shown), from which the diamond layer 140 can be grown to about 1.5 µm. Subsequent to configuring the diamond layer 140, the polysilicon 120 can be deposited to about 2 µm over at least the device 170 side and the diamond 140 side. In addition, the polysilicon 120 can encapsulate the structure as shown in FIG. 1B. The polysilicon 120 deposited over the diamond layer 140 can be planarized (120a) by a chemical mechanical polishing (CMP) process, after which bond clean can be performed.

The thin nitride layer 150 can be deposited or otherwise formed to a thickness having suitable ion blocking effectiveness. The thin nitride layer 150 can be one of $Si_3N_4$, $Si_xN$, AlN, TaN, TiN, and silicon oxy-nitride. Certain metallic barriers can include TiW and TiWN as potential "metallic" barriers. As depicted in FIG. 1C, the CMP planarized polysilicon 120a can be bonded to the handle 110, as also known in the art. Subsequent to bonding the device wafer 170 structure with the handle 110, the bonded wafer structure is inverted for additional processing as will be further shown and described.

In FIG. 1D, the polysilicon 120 on the device 170 side, and the device wafer 170 itself, can be treated to reduce its thickness to within about 15 µm of the diamond-silicon interface. The treatment can include grinding as known in art, followed by a KOH clean, a post polish clean, and B-clean. B-clean consists of $H_2SO_4/H_2O_2$ (to remove organics), 10:1 HF diluted with DI $H_2O$, SC1 ($NH_4OH/H_2O_2$ to remove particles), and SC2 ($HCL/H_2O_2$ to remove metallics). Further, a polysilicon layer 120 can again be formed on the reduced thickness device 170 silicon. For example, the polysilicon can be formed to a thickness of about 2 µm. It will be appreciated that polysilicon is simultaneously deposited on the front and the backside of the wafer. This backside polysilicon is used for stress control in order to reduce warpage of the wafer.

As depicted in FIG. 1E, the device 170 side can be polished to remove the polysilicon layer 120, resulting in a device silicon thickness of about 3 to about 7 µm. In order to render this device silicon thickness, polishing can remove about 7 to about 10 µm of polysilicon 120 and device 170 silicon.

In FIGS. 1D and 1E, the thin nitride layer 150 can include a silicon nitride at a thickness of about 0.1 µm, and the diamond layer 140 can be at a thickness of about 1.5 µm. In certain embodiments, hydrogen implantation (SMART-CUT®) can be used to separate wafers after bonding. Here, the implant is done before the wafers are bonded. After bonding, a thermal step splits the wafer at the peak of the implant. This hydrogen implantation can be used in the formation of thin Silicon-on-Diamond-on-Silicon layers, in addition to grinding and polishing. For this approach, thinner device silicon in the range of about 0.1 to about 1.5 microns are generally possible, depending on the hydrogen implant energy.

FIGS. 2A through 2E depict a diamond silicon-on-insulator (SOI) device (e.g., 200 in FIG. 2E) and corresponding method of forming, in accordance with additional embodiments of the present teachings. It should be readily apparent to one of ordinary skill in the art that the device 200 and method depicted in FIGS. 2A through 2E represents a generalized schematic illustration and that other steps and components can be added or existing steps and components can be removed or modified.

Figure 2D:
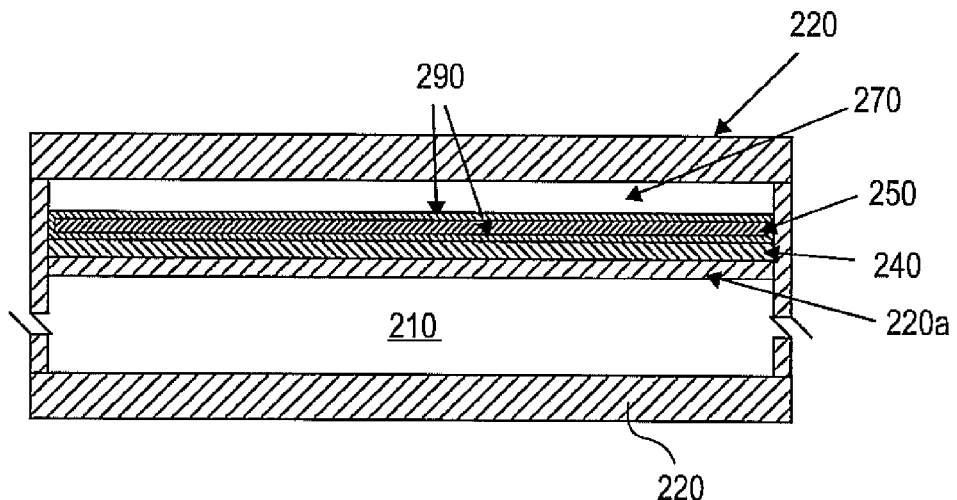
Figure 2E:
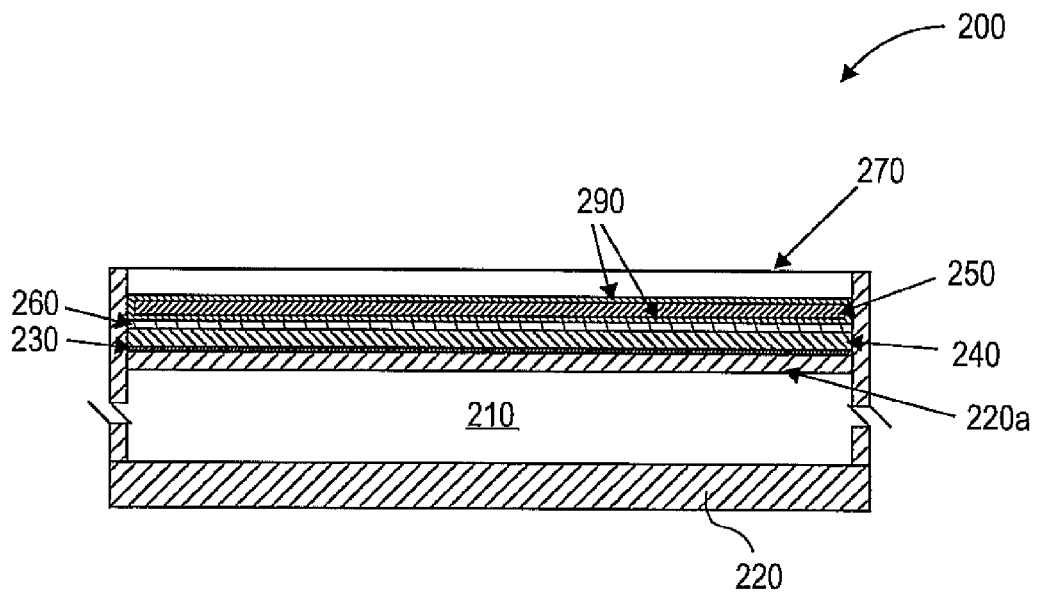

In FIG. 2E, the device structure 200 can include a handle wafer 210, a planarized polysilicon 220 on the handle wafer 210, a nitride barrier 230 on the planarized polysilicon 220a, a diamond layer 240 on nitride layer 230, a thin polysilicon layer 260 (of about 300 Å used to promote seeding) on the diamond layer 240, a thin nitride layer 250 on polysilicon layer 260, a thin pad oxide layer 290 (of about 650 Å) in the thin nitride layer 250, a device 270 on pad oxide layer 290, and a polysilicon encapsulant 280, the polysilicon encapsulant 280 planarized and removed from the device side as shown.

In FIG. 2A, the handle wafer 210 is depicted, which is suitable for the exemplary embodiments. The handle wafer 210 can include an oxide material. The handle wafer 210 can be formed in a process including, for example, steps of spin/rinse/dry (SRD), BW Backtouch, KOH Clean, Scribe, Post Backtouch clean, and bond clean.

An exemplary device wafer 270 is depicted in FIG. 2B. The device wafer 270 can include a thin oxide layer 290 on a surface of the device wafer 270, a thin nitride layer 250 on a surface of the oxide layer 290, (a thin (300 Å) polysilicon layer 260, as shown in FIG. 2E, can be inserted here to promote seeding), a diamond layer 240 on a surface of the thin nitride layer 250, and a polysilicon coating 220 on both of the diamond layer 240 and the opposing surface of the device wafer 270. In addition, a thin layer of polysilicon (about 300 Å) can be deposited on top of the nitride to promote seeding. In the drawing layer 250 includes thin oxide layer 290 between thin nitride layer 250 and device 270. In certain embodiments, an additional nitride layer 230 can be formed on the diamond layer 240. The additional nitride layer 230 can be a nitride barrier on top of diamond 240 (i.e., between the diamond layer 240 and a planarized polysilicon 220a) to totally encapsulate diamond film layer 240.

The device wafer 270 can include a substrate, wafer or epitaxial layer, silicon or other semiconductor layer. In general, the semiconductor layer can be any material which can withstand diamond growth conditions (temperatures greater than 700° C., for example). For example, the semiconductor can include at least one of silicon, SiGe, SiC, GaN, InP, GaAs, AlGaN, InAlN, or combinations thereof.

The device wafer 270 can be formed in a process in which the wafer is typically pre-cleaned in SC1/SC2 solutions, for example, a pad oxide is grown to a thickness of about 300 Å (it has been determined by the inventors that 625 Å of pad oxide can be needed as an etchstop at Trench etch), and a low pressure chemical vapor deposition (LPCVD) silicon nitride is deposited to a thickness of about 1000 Å. In certain embodiments the pad oxide thickness can be in the range of about 100 Å to about 1000 Å range. A pad oxide at the thinner end of the range can minimize thermal resistance, but a pad oxide at a thicker end of the range can also be utilized depending on the process architecture and flow. A diamond seed layer (not shown) can be deposited, from which the diamond layer 240 can be grown to a thickness of about 1.5 µm. In certain embodiments, the diamond layer 240 can be in the range of about 0.1 µm to about 100 microns. Increased thermal conductivity can be obtained at the higher end of the exemplary range. Subsequent to configuring the diamond layer 240, the polysilicon 220 can be deposited to a thickness of about 2 µm over at least the device 270 side and the diamond 240 side. In addition, the polysilicon 220 can encapsulate the structure as shown in FIG. 2B. The polysilicon 220 deposited over the diamond layer 240 can be planarized (220a) by a CMP process, after which a bond clean can be performed. In certain embodiments, the polysilicon 220 can be undoped, unless it is desirable to have a doped layer to form a "low resistance buried layer," which may be beneficial for some approaches like NPN bipolar flows.

The thin nitride layer 250 and nitride layer 230 can be deposited or otherwise formed to a thickness having suitable ion blocking effectiveness. In certain embodiments, the additional nitride barrier 230 can be formed at the interface of the diamond layer 240 and the polysilicon layer 220. With the additional nitride barrier layer 230, the diamond layer 240 can be entirely encapsulated.

The thin nitride layer 250 and the additional nitride barrier layer 230 can be deposited or otherwise formed to a thickness having suitable ion blocking effectiveness. The nitride barrier layer 230 can have a thickness of from about 500 Å to about 3000 Å. Further, the nitride barrier layer 230 can have a thickness of about 1000 Å. The thin nitride layer 250 and nitride barrier layer 230 can be one of $Si_3N_4$, $Si_xN$, AlN, TaN, and TiN.

As depicted in FIG. 2C, the CMP planarized polysilicon 220a can be bonded to the handle 210, as known in the art. Subsequent to bonding the structure of FIG. 2B with the handle 210, the bonded wafer structure is inverted for further processing as will be further shown and described.

In FIG. 2D, the polysilicon 220 on the device 270 side and the device wafer itself can be treated to reduce its thickness to within about 15 μm of the diamond-silicon interface. The treatment can include grinding as known in art, followed by a KOH clean, a post polish clean, and B-clean. Further, a polysilicon layer 220 can be formed on the reduced thickness device 270. For example, the polysilicon 220 can be formed to a thickness of about 2 μm.

As depicted in FIG. 2E, the device 270 side can be polished to remove the polysilicon layer 220, resulting in a device silicon thickness of about 3 μm to about 7 μm. In order to render this device silicon thickness, polishing can remove about 7 μm to about 10 μm of polysilicon and device silicon structure.

In FIGS. 2D and 2E, the thin nitride 250 can include a silicon nitride at a thickness of about 0.1 μm, and the diamond layer 240 can be at a thickness of about 1.5 μm.

In the embodiment described, it will be appreciated that the polysilicon layer on top of nitride can be provided to promote seeding. The polysilicon has better thermal conductivity than dielectrics, and this allows maximization of the thickness of the nitride barrier itself (because oxidizing the nitride to improve nucleation reduces the barrier properties and increases the thermal resistance). Polysilicon also has similar nucleation properties as silicon (better than moat cleaned nitride). Depositing polysilicon on one side only can reduce the diamond deposition on the side that is not polysilicon coated, if for example, the underlying layer is nitride. The polysilicon can further act as a gettering layer (can trap impurities in grain boundaries). In addition, moat etch can be used to leach out metallic contaminates from the seed layer if polysilicon is used on top of the nitride layer. Even further, the described thin nitride layer between the diamond seed layer and device silicon will block the oxidation of the diamond layer and provide a good etch stop for Trench etch. A pad oxide thickness of 650 Å on top of the nitride provides a better etch stop and ensures the entire thickness of nitride is preserved after Trench etch. This can solve the problem in which integration of Trench isolation is problematic due to flammability of a diamond layer when exposed to normal thermal oxidation conditions. The described embodiments further solve process issues for diamond SOI integration at minimal expense to heat flow because the nitride and pad oxide layers are thin. Thermal conductivity for LPCVD stoichiometric silicon nitride=25-36 W/m-K. By comparison, silicon dioxide=1.3 W/m-K, room temperature silicon=148 W/m-K, and diamond=1300 W/m-K.

In each of the embodiments described, in situ deposition of nitride and/or polysilicon can be performed in the diamond reactor, to eliminate exposure of subsequent nitride and/or polysilicon deposition systems to cross-contamination.

In certain embodiments, the handle wafer can be used for the device wafer. This approach can eliminate possible cross-contamination to other fabrication equipment.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g., −1, −2, −3, −10, −20, −30, etc.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

The invention claimed is:

1. A method of forming a semiconductor device, the method comprising:
   forming a device wafer, wherein forming the device wafer comprises:
      forming an oxide layer on a device silicon layer,
      forming a nitride barrier layer on the oxide layer,
      forming a diamond layer on the nitride barrier layer,
      depositing a thin nitride layer on the diamond layer,
      depositing a polysilicon layer on the device wafer, and
      planarizing the polysilicon on an active side of the device wafer;
   the method of forming a semiconductor device further comprising:
      attaching the device wafer to a handle wafer to form a device structure;
      depositing polysilicon on the handle wafer side of the device structure; and
      polishing a device side of the device structure to within about 3 to about 7 μm of a diamond-silicon interface of the device wafer.

2. The method of claim 1, further comprising:
   placing a nitride barrier at an interface of the diamond layer and the polysilicon, the nitride barrier totally encapsulating the diamond layer.

3. The method of claim 1, wherein the nitride comprises silicon nitride.

4. The method of claim 1, wherein the thin nitride layer comprises a thickness of about 0.1 μm.

5. A method of forming a semiconductor device, the method comprising:
   forming a thin pad oxide and thin nitride barrier layer on a silicon wafer;
   forming a barrier seeding layer surface to promote diamond growth;
   growing a diamond layer from the seeding layer;
   depositing a thin nitride barrier layer on the diamond layer;
   depositing polysilicon on the thin nitride barrier layer to form a polysilicon layer; and
   polishing the polysilicon layer.

6. The method of claim 5, further comprising:
   selectively bonding the semiconductor device to a silicon layer.

7. A method of forming a semiconductor device, the method comprising:
   forming a thin pad oxide and thin nitride barrier on a silicon wafer;
   forming one of a thin polysilicon layer or a thin oxide layer on the thin nitride barrier to promote diamond growth;
   growing a seeding layer on the thin polysilicon layer or the thin oxide layer to promote diamond growth;
   growing a diamond layer from the seeding layer;
   depositing a thin nitride barrier layer on the diamond layer;
   depositing polysilicon on the thin nitride barrier layer to form a polysilicon layer; and
   polishing the polysilicon layer.

8. The method of claim 7, further comprising:
   selectively bonding the semiconductor device to a silicon layer.

9. A semiconductor device comprising:
   a diamond silicon-on-insulator (SOI) layer;
   a device silicon layer;
   a thin nitride layer between the diamond SOI layer and device silicon layer; and
   a nitride barrier layer on a surface of the diamond SOI layer opposing the thin nitride layer, the diamond layer totally encapsulated by the thin nitride layer and nitride barrier layer.

* * * * *